United States Patent
Nagao et al.

(10) Patent No.: US 11,626,347 B2
(45) Date of Patent: Apr. 11, 2023

(54) SHARED BASE PLATE AND SEMICONDUCTOR MODULE PROVIDED WITH SAME

(71) Applicant: Mitsubishi Electric Corporation, Tokyo (JP)

(72) Inventors: Takashi Nagao, Tokyo (JP); Kensuke Takeuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 75 days.

(21) Appl. No.: 16/975,195

(22) PCT Filed: Apr. 25, 2018

(86) PCT No.: PCT/JP2018/016734
§ 371 (c)(1),
(2) Date: Aug. 24, 2020

(87) PCT Pub. No.: WO2019/207664
PCT Pub. Date: Oct. 31, 2019

(65) Prior Publication Data
US 2020/0395271 A1    Dec. 17, 2020

(51) Int. Cl.
*H01L 23/48* (2006.01)
*H01L 23/00* (2006.01)
(Continued)

(52) U.S. Cl.
CPC .............. *H01L 23/48* (2013.01); *H01L 24/37* (2013.01); *H01L 24/40* (2013.01); *H01L 25/18* (2013.01);
(Continued)

(58) Field of Classification Search
None
See application file for complete search history.

(56) References Cited

U.S. PATENT DOCUMENTS

| 5,049,973 A | 9/1991 | Satriano et al. |
| 2011/0285336 A1 | 11/2011 | Fujita et al. |

(Continued)

FOREIGN PATENT DOCUMENTS

| JP | 5201171 B2 | 6/2013 |
| JP | 2013-179744 A | 9/2013 |

OTHER PUBLICATIONS

International Search Report for PCT/JP2018/016734 dated Jul. 10, 2018[PCT/ISA/210].
(Continued)

*Primary Examiner* — Michelle Mandala
*Assistant Examiner* — Jordan M Klein
(74) *Attorney, Agent, or Firm* — Sughrue Mion, PLLC; Richard C. Turner

(57) ABSTRACT

A shared base plate includes a plurality of base portions to which a plurality of electronic components including semiconductor switching elements are to be mounted, and a terminal formed portion formed so as to extend from the base portion to the outer side. The terminal formed portion includes a discrimination terminal which is used as a terminal in one of a first semiconductor module and a second semiconductor module and which is not used as a terminal in the other one. If the discrimination terminal that is not used as a terminal is cut to be short, it becomes possible to easily discriminate the semiconductor module from another semiconductor module having the shared base plate by outer appearances.

14 Claims, 6 Drawing Sheets

(51) Int. Cl.
   *H01L 25/18*   (2006.01)
   *H02M 7/48*   (2007.01)
(52) U.S. Cl.
   CPC ..... *H02M 7/48* (2013.01); *H01L 2224/40095* (2013.01); *H01L 2224/40245* (2013.01); *H01L 2224/48247* (2013.01); *H01L 2924/1306* (2013.01)

(56) References Cited

U.S. PATENT DOCUMENTS

| | | | | |
|---|---|---|---|---|
| 2012/0306328 | A1* | 12/2012 | Fujita | H01L 23/4006 |
| | | | | 310/68 D |
| 2013/0032855 | A1 | 2/2013 | Macheiner et al. | |
| 2013/0221532 | A1* | 8/2013 | Fujita | H01L 24/37 |
| | | | | 257/773 |
| 2013/0307129 | A1* | 11/2013 | Fujita | H01L 24/40 |
| | | | | 257/666 |
| 2018/0233437 | A1* | 8/2018 | Kamiyama | H01L 23/4952 |

OTHER PUBLICATIONS

Office Action dated Sep. 21, 2021 from the Japanese Patent Office in JP Application No. 2020-515356.
Extended European Search Report dated Apr. 6, 2021 in European Application No. 18915898.3.

* cited by examiner

SHARED BASE PLATE AND SEMICONDUCTOR MODULE PROVIDED WITH SAME

CROSS REFERENCE TO RELATED APPLICATIONS

This application is a National Stage of International Application No. PCT/JP2018/016734 filed Apr. 25, 2018.

TECHNICAL FIELD

The present disclosure relates to a shared base plate used for a semiconductor module, and a semiconductor module provided with the shared base plate.

BACKGROUND ART

A control unit of a vehicle electric power steering device includes a control circuit including a central processing unit (CPU), an inverter circuit for supplying current to three-phase windings of a motor, a power supply relay, and the like. In the case of forming such a control unit in a semiconductor module, various circuit configurations and component configurations are conceivable as follows: a configuration including one to three bridge circuits of an inverter circuit, a configuration including a power supply relay, a configuration in which some of current detection shunt resistors or switching elements are omitted, and the like.

For example, Patent Document 1 discloses a semiconductor module including low-potential-side switching elements and high-potential-side switching elements composing an inverter circuit, power supply relays, shunt resistors as current detection means, and the like. In such a semiconductor module, the electronic components such as the semiconductor switching elements and the shunt resistors are mounted to a base plate made of copper or copper alloy, and are sealed by molding resin. In addition, a plurality of terminals such as plus and minus power supply terminals, an output (load) terminal, and a control terminal formed by the base plate are arranged outside the molding resin.

CITATION LIST

Patent Document

Patent Document 1: Japanese Patent No. 5201171

SUMMARY OF THE INVENTION

Problems to Be Solved by the Invention

Among semiconductor modules, even if the circuit configurations thereof are different, the internal structures such as component arrangements and wiring may be considerably similar to each other. However, in conventional manufacturing of semiconductor modules, base plates corresponding to individual circuit configurations and component arrangements are designed, and therefore different base plates are used for individual products. Thus, there is a problem that the types of components are increased and the cost is increased.

The present disclosure has been made to solve the above problem, and an object of the present disclosure is to provide a shared base plate that enables suppression of increase of the types of components of semiconductor modules, and reduce the manufacturing cost for semiconductor modules by having the shared base plates.

Solution to the Problems

A shared base plate according to the present disclosure is a shared base plate to be used for plural types of semiconductor modules different in circuit configuration or component configuration, the shared base plate including: a base portion to which a plurality of electronic components including a semiconductor switching element are to be mounted; and a terminal formed portion formed so as to extend from the base portion to an outer side, wherein the plural types of semiconductor modules include at least a first semiconductor module and a second semiconductor module, and the terminal formed portion includes a discrimination terminal which is used as a terminal in one of the first semiconductor module and the second semiconductor module and which is not used as a terminal in the other one.

A semiconductor module according to the present disclosure is a semiconductor module including: the shared base plate according to the present disclosure; a plurality of electronic components including a semiconductor switching element and mounted to the base portion of the shared base plate; a wiring member connecting the electronic component with the base portion or another of the electronic components; and resin covering the base portion, the electronic components, and the wiring member.

Effect of the Invention

The shared base plate according to the present disclosure can be used for plural types of semiconductor modules different in circuit configuration or component configuration. Thus, components of the semiconductor modules can be standardized and increase in the types of components can be suppressed. As a result, the component cost can be reduced, so that the manufacturing cost for the semiconductor modules can be reduced.

Objects, features, aspects, and effects of the present disclosure other than the above will become more apparent from the following detailed description with reference to the drawings.

DESCRIPTION OF EMBODIMENTS

Embodiment 1

Figure 1:
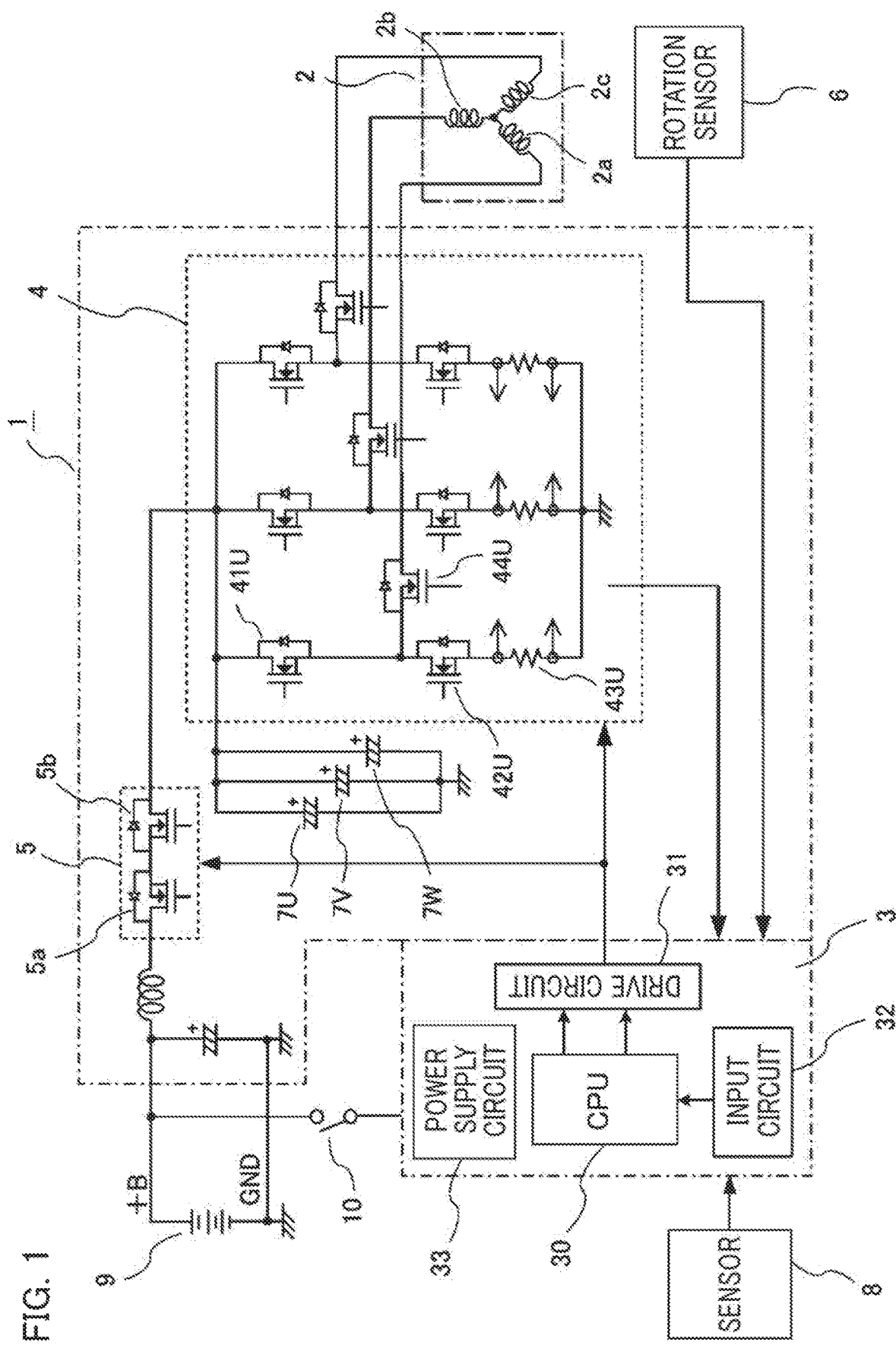
FIG. 1 shows a circuit configuration of an entire system of a vehicle electric power steering device according to embodiment 1.
Figure 2:
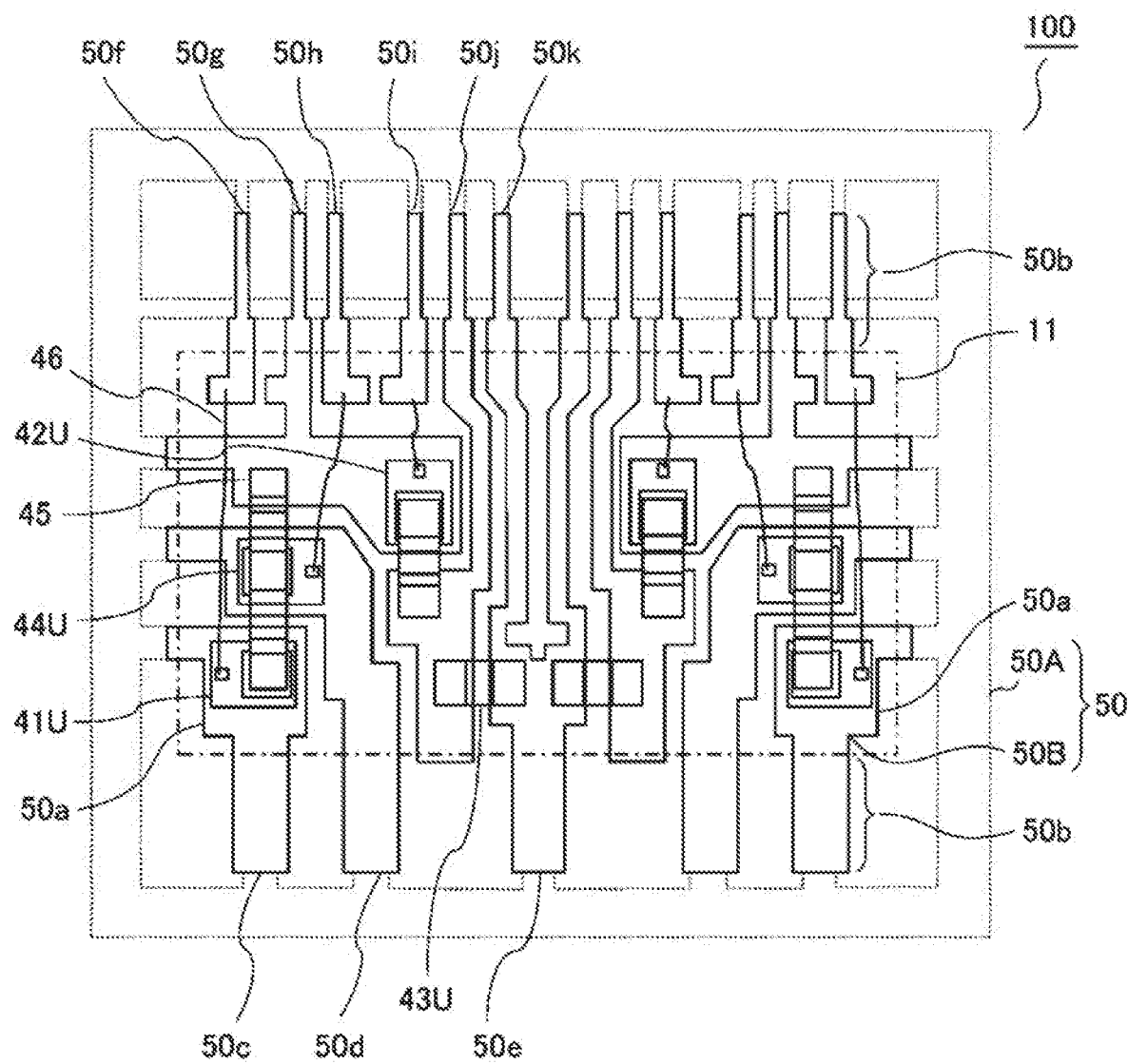
FIG. 2 shows the internal configuration of a first semiconductor module provided with a shared base plate according to embodiment 1.
Figure 3:
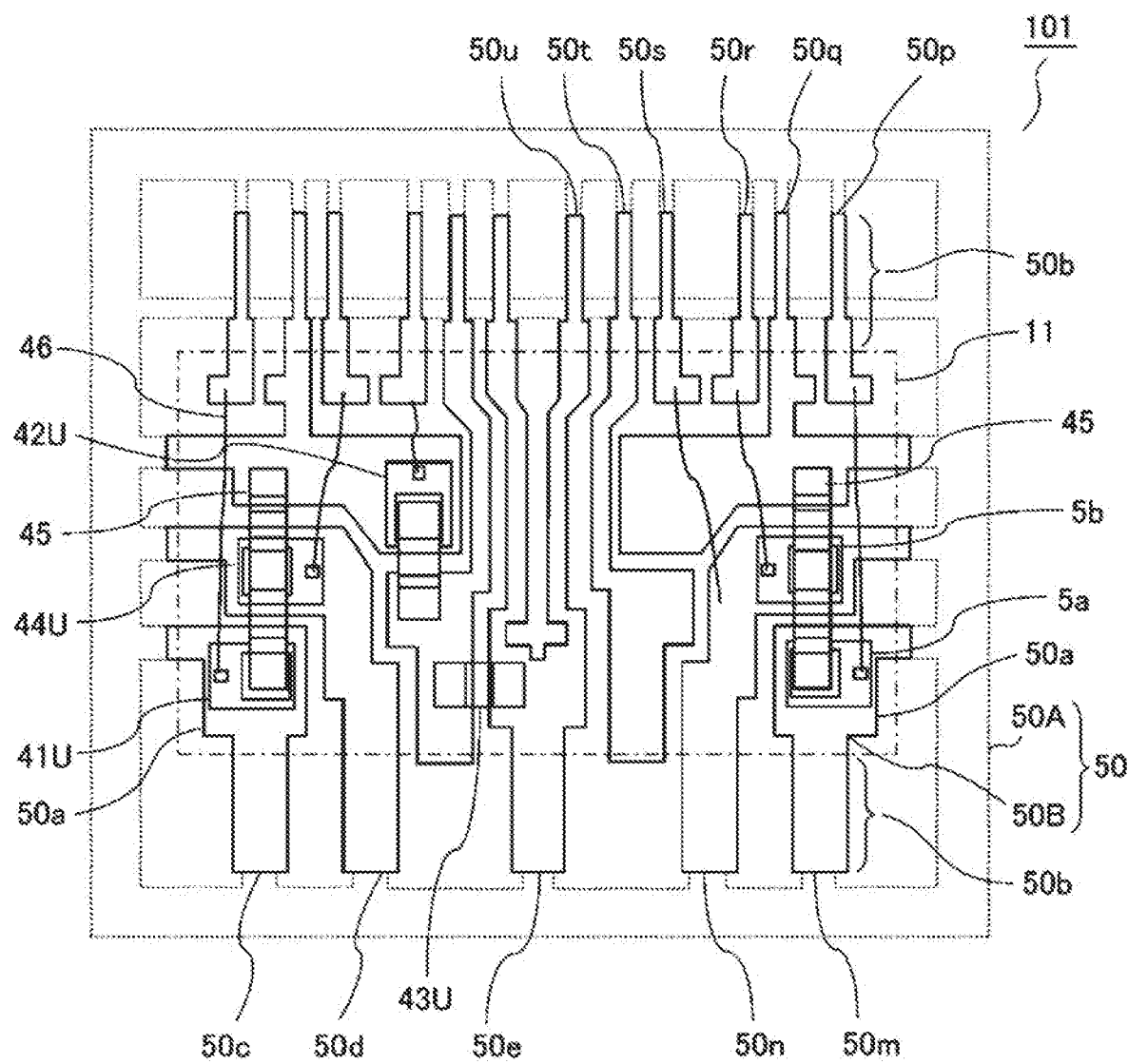
FIG. 3 shows the internal configuration of a second semiconductor module provided with the shared base plate according to embodiment 1.

Hereinafter, a shared base plate and a semiconductor module provided with the shared base plate according to embodiment 1 will be described with reference to the drawings. FIG. 1 shows a circuit configuration of an entire system of a vehicle electric power steering device using the semiconductor module according to embodiment 1. FIG. 2 shows the internal configuration of a first semiconductor module provided with the shared base plate according to embodiment 1, and FIG. 3 shows the internal configuration of a second semiconductor module provided with the shared base plate according to embodiment 1. In the drawings, the same or corresponding parts are denoted by the same reference characters.

As shown in FIG. 1, the vehicle electric power steering device includes a control unit 1, a motor 2, a rotation sensor 6, a sensor 8, a battery 9, an ignition switch 10, and the like. The motor 2 is a brushless motor having three-phase windings (U-phase winding 2a, V-phase winding 2b, W-phase winding 2c). The rotation sensor 6 for detecting the rotation angle of the motor 2 is provided near the motor 2.

The control unit 1 includes a control circuit 3 having a CPU 30 as a main component, an inverter circuit 4 for supplying current to the windings of the motor 2, a power supply relay 5, and the like. The control circuit 3 includes the CPU 30, a drive circuit 31, an input circuit 32, and a power supply circuit 33. The CPU 30 receives an input signal from the sensor 8 such as a vehicle speed sensor or a torque sensor for detecting a steering wheel operation force, rotation angle information from the rotation sensor 6, and the like, and calculates a current value for rotating the motor 2. Further, the CPU 30 outputs a control signal based on the calculation result to the inverter circuit 4 via the drive circuit 31, to drive each switching element, and receives a current detection signal of the inverter circuit 4, to perform feedback control.

The inverter circuit 4 has three bridge circuits corresponding to three-phase windings of the motor 2. Since the circuits for the three phases are the same, description will be given focusing on the U phase as an example. In the inverter circuit 4, a semiconductor switching element 41U as a high-potential-side switching element and a semiconductor switching element 42U as a low-potential-side switching element are connected in series to each other, and at an intermediate connection point therebetween, a semiconductor switching element 44U having a relay function capable of connection to and disconnection from a coil (load output) of the motor 2 is connected.

In addition, a shunt resistor 43U for current detection is connected downstream of the semiconductor switching element. 42U. The inverter circuit 4 is provided with terminals for detecting the potential difference between both ends of the shunt resistor 43U and converting the potential difference to a current value, as shown by arrows at both ends of the shunt resistor 43U in FIG. 1. Monitor signals at various parts in the inverter circuit 4 are transmitted to the CPU 30 via the input circuit 32 of the control circuit 3.

Smoothing capacitors 7U, 7V, 7W are connected in parallel between a plus power supply and the ground. The power supply relay 5 is provided upstream of the inverter circuit 4, and two semiconductor switching elements 5a, 5b are connected in series to each other. The power supply relay 5 has a relay function capable of supplying power to the inverter circuit 4 and interrupting the power.

In the case of implementing the circuit configuration as shown in FIG. 1 in a semiconductor module, various circuit configurations or component configurations are conceivable as follows: a configuration including one (or two or three) bridge circuit of the inverter circuit 4, a configuration including (or not including) the power supply relay 5, a configuration in which some of the shunt resistors or the switching elements are omitted (or not omitted), and the like. Embodiment 1 proposes a shared base plate used for, in particular, a semiconductor module including two bridge circuits among plural types of semiconductor modules different in circuit configuration or component configuration.

The shared base plate according to embodiment 1 will be described with reference to FIG. 2 and FIG. 3. A plate 50 is made of a metal material such as copper or copper alloy, and includes an outer frame 50A and a shared base plate 50B. In FIG. 2 and FIG. 3, a dotted-dashed line indicates an area covered with molding resin 11, and a broken line indicates the outer frame 50A of the plate 50. It is noted that the outer frame 50A is used for, for example, conveyance between steps in a manufacturing process for the semiconductor module, and is cut away at the time of completion.

The shared base plate 50B can be used for plural types of semiconductor modules different in circuit configuration or component configuration, and in embodiment 1, the shared base plate 50B is used for a first semiconductor module 100 shown in FIG. 2 and a second semiconductor module 101 shown in FIG. 3. The first semiconductor module 100 has an H bridge circuit including two bridge circuits, and the second semiconductor module 101 has one bridge circuit and one relay function circuit (power supply relay 5 shown in FIG. 1).

The shared base plate 50B includes a plurality of base portions 50a to which a plurality of electronic components including the semiconductor switching elements 41U, 42U, 44U are mounted, and terminal formed portions 50b formed so as to extend from the base portions 50a to the outer side. The base portions 50a are also used as wiring. The terminal formed portions 50b include control terminals for input and output of control signals, and power terminals which are formed to be wider than the control terminals and through which larger currents flow than in the control terminals.

In FIG. 2, the upper-side terminal formed portion 50b includes control terminals 50f, 50h, 50i, etc., and the lower-side terminal formed portion 50b includes power terminals 50c, 50d, 50e, etc. In the following description, these terminals are referred to as control terminals or power terminals on the basis of their shapes, irrespective of whether or not these terminals are in use.

In the first semiconductor module 100, two bridge circuits that are the same are arranged symmetrically as shown in FIG. 2. The U-phase bridge circuit on the left side in the drawing will be described. The high-potential-side semiconductor switching element. 41U is mounted to the base portion 50a that leads to the power terminal 50c which is a plus power supply terminal. The semiconductor switching element 41U is connected to the semiconductor switching element 44U via a jumper wire 45, and is further connected to the low-potential-side semiconductor switching element 42U. The semiconductor switching elements 41U, 42U, 44U are, for example, field effect transistors (FET). The jumper wire 45 is formed from a copper plate and has a bridge shape.

The power terminal 50d is an output terminal to the motor. The power terminal 50e is a ground terminal and is shared by the two bridge circuits. In light of the drive method for the three-phase winding motor, currents do not flow at the same time through ground terminals for the respective phases, and therefore the power terminal 50*e* can be shared. It is noted that the ground terminal may be provided for each phase.

The shunt resistor 43U is mounted so as to stride between the base portions 50*a*. Wire bonds 46 are used for gate connection of the semiconductor switching elements 41U, 42U, 44U. The control terminals 50*f*, 50*h*, 50*i* are gate signal terminals for the semiconductor switching elements 41U, 44U, 42U, respectively. The control terminals 50*j*, 50*k* are used for detection of terminal voltage at both ends of the shunt resistor 43U. The control terminal 50*g* is connected to the connection point among the semiconductor switching elements 41U, 42U, 44U, but is not used as a terminal.

On the other hand, in the second semiconductor module 101, a combination circuit including the power supply relay 5 (see FIG. 1) and one bridge circuit is provided as shown in FIG. 3. In FIG. 3, the left side is the same bridge circuit as that shown in FIG. 2, and therefore, the description thereof is omitted and the power supply relay on the right side will be described. A power terminal 50*m* is a plus power supply input terminal, and the semiconductor switching element 5*a* of the power supply relay 5 is mounted to the base portion 50*a* that leads to the power terminal 50*m*. The source portion of the semiconductor switching element 5*a* is connected to the semiconductor switching element 5*b* via a jumper wire 45. The semiconductor switching elements 5*a*, 5*b* are, for example, FET.

The control terminals 50*p*, 50*r* are gate signal terminals for the respective semiconductor switching elements 5*a*, 5*b*, and are connected to the gates of the semiconductor switching elements 5*a*, 5*b* via wire bonds 46. A control terminal 50*q* leading from the base portion 50*a* that is connected to the semiconductor switching elements 5*a*, 5*b* via the jumper wire 45 is used for monitoring voltage at the intermediate point between the semiconductor switching elements 5*a*, 5*b*. A control terminal 50*s* is at the same potential as the plus power supply of the inverter circuit. 4 and is connected to a power terminal 50*n*. Large current flows to the power terminal 50*n*, and the control terminal 50*s* is used for monitoring.

It is noted that control terminals 50*t*, 50*u* are not used as terminals in the second semiconductor module 101, but are used as control terminals for detecting terminal voltage at both ends of the shunt resistor in the first semiconductor module 100. In addition, the control terminal 50*q* of the second semiconductor module 101 is used for monitoring voltage at the intermediate point between the semiconductor switching elements 5*a*, 5*b*, but in the first semiconductor module 100, as with the control terminal 50*g*, the control terminal 50*q* is connected to the connection point among the three semiconductor switching elements and is not used as a terminal.

As described above, the terminal formed portion 50*b* of the shared base plate 50B includes discrimination terminals which are used as terminals in one of the first semiconductor module 100 and the second semiconductor module 101, and which are not used as terminals in the other one. In the examples shown in FIG. 2 and FIG. 3, the control terminals 50*g*, 50*q*, 50*t*, 50*u*, etc. correspond to discrimination terminals. It is noted that the discrimination terminals are not limited to control terminals, and power terminals may be used as discrimination terminals.

In the case where the discrimination terminals are not used as control terminals or power terminals, the discrimination terminals may be formed to be shorter than the adjacent control terminal or power terminal. This makes it possible to easily discriminate the first semiconductor module 100 and the second semiconductor module 101 by outer appearances. In embodiment 1, if the control terminals 50*t*, 50*u* which are not used in the second semiconductor module 101 are cut to be shorter than the adjacent control terminal 50*s*, the second semiconductor module 101 can be discriminated from the first semiconductor module 100. Similarly, if the control terminal 50*g* which is not used in the first semiconductor module 100 is cut, the first semiconductor module 100 can be discriminated from the second semiconductor module 101.

Thus, the example in which the shared base plate 50B is used for the first semiconductor module 100 and the second semiconductor module 101 has been described. The shared base plate 50B can also be used for a semiconductor module having another circuit configuration or component configuration. For example, the shared base plate 50B can be used for a third semiconductor module (not shown) in which a component corresponding to the shunt resistor 43U or the semiconductor switching element 44U for U phase shown in FIG. 1 is omitted.

The third semiconductor module is the same in circuit configuration as the first semiconductor module 100, but is different in component configuration. In the case of using the shared base plate 50B for the third semiconductor module, the semiconductor switching element 44U or the shunt resistor 43U of the first semiconductor module 100 (see FIG. 2) is not mounted, and the high-potential-side semiconductor switching element 41U is connected to the low-potential-side semiconductor switching element 42U via the jumper wire 45 and the base portion 50*a*. In addition, the shared base plates 50B can also be shared by an H bridge circuit for brushless motor and an H bridge circuit for brush-equipped motor.

As described above, the shared base plate 50B according to embodiment 1 can be used for plural types of semiconductor modules different in circuit configuration or component configuration. Thus, components can be standardized and increase in the types of components can be suppressed. As a result, the component cost can be reduced, so that the manufacturing cost for the semiconductor modules can be reduced and the number of working management processing steps can be decreased.

Further, if discrimination terminals that are not used as terminals are cut to be shorter than the adjacent other terminal, it becomes possible to easily discriminate the semiconductor module from another semiconductor module having the shared base plate 50B by outer appearances. Thus, erroneous attachment on semiconductor modules is prevented, so that working efficiency is improved.

Embodiment 2

Figure 4:
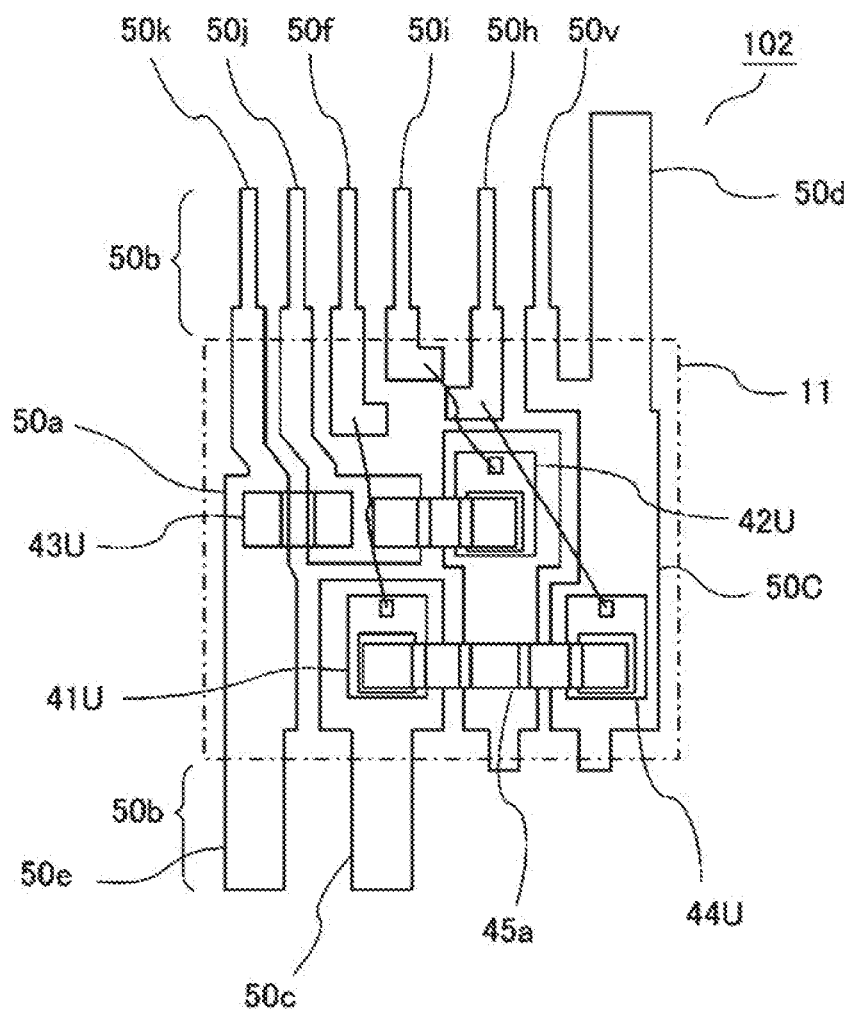
FIG. 4 shows the internal configuration of a first semiconductor module provided with a shared base plate according to embodiment 2.
Figure 5:
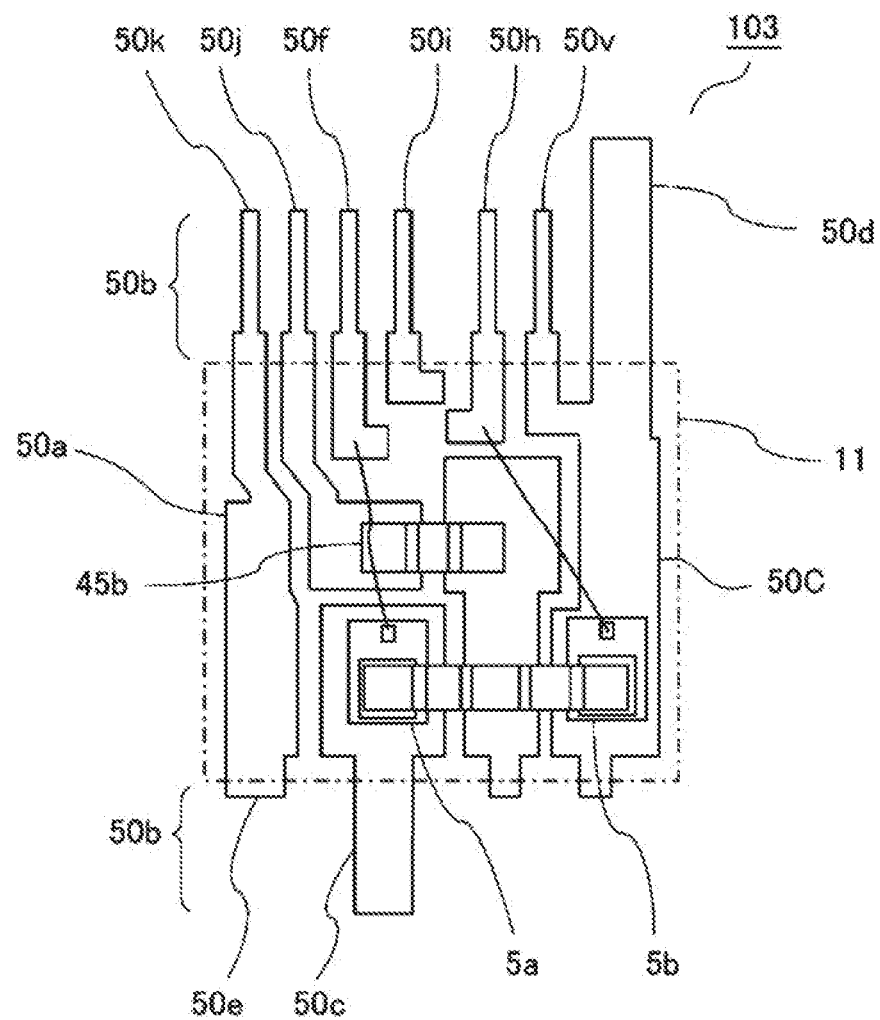
FIG. 5 shows the internal configuration of a second semiconductor module provided with the shared base plate according to embodiment 2.
Figure 6:
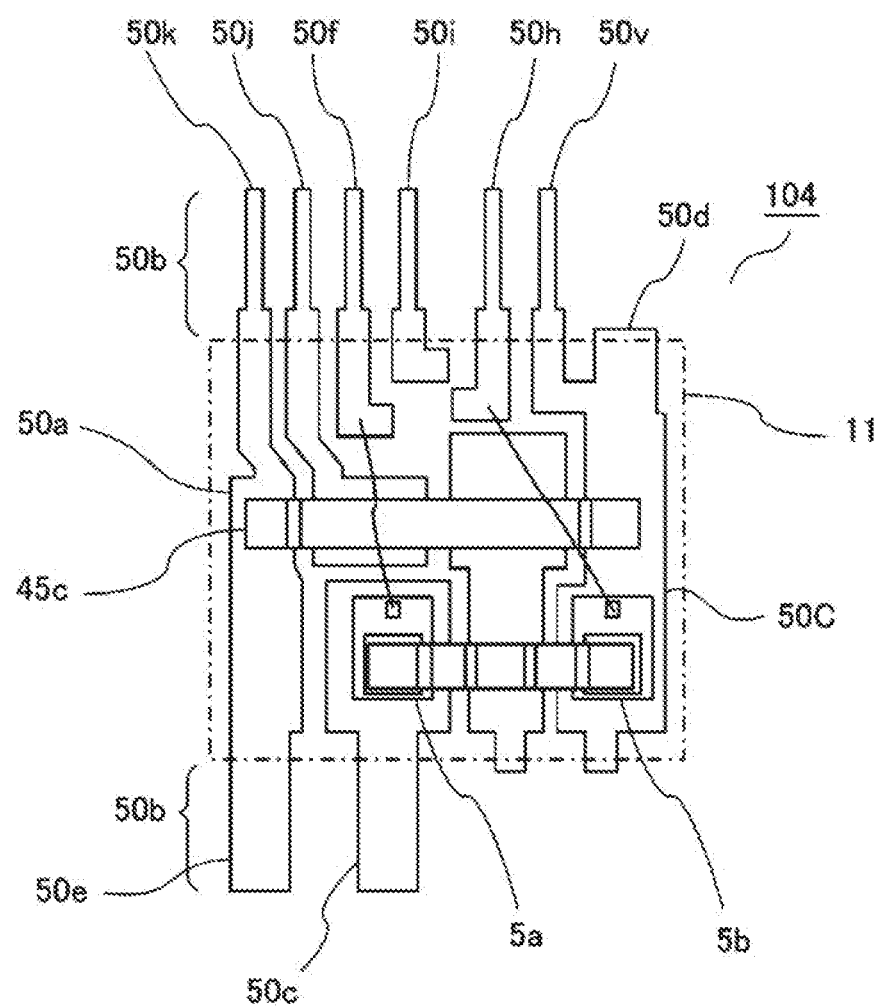
FIG. 6 shows the internal configuration of a third semiconductor module provided with the shared base plate according to embodiment 2.

FIG. 4 shows the internal configuration of a first semiconductor module according to embodiment 2, FIG. 5 shows the internal configuration of a second semiconductor module according to embodiment 2, and FIG. 6 shows the internal configuration of a third semiconductor module according to embodiment 2. A first semiconductor module 102, a second semiconductor module 103, and a third semiconductor module 104 are each provided with a shared base plate 50C according to embodiment 2. It is noted that the circuit configuration of an entire system of a vehicle electric power steering device using the semiconductor module according to embodiment 2 is the same as in the above embodiment 1, and therefore FIG. 1 is applied.

As shown in FIG. 4 to FIG. 6, the shared base plate 500 includes a plurality of base portions 50a to which a plurality of electronic components including semiconductor switching elements are mounted, and terminal formed portions 50b extending from the base portion 50a to the outer side. In the shared base plate 500 of the first semiconductor module 102 shown in FIG. 4, terminals having the same functions as those on the shared base plate 50B of the first semiconductor module 100 (see FIG. 2) according to the above embodiment 1 are denoted by the same reference characters. In addition, in FIG. 4 to FIG. 6, irrespective of the functions of terminals, terminals located at the same positions on the terminal formed portions 50b are denoted by the same reference characters. In FIG. 4 to FIG. 6, dotted-dashed lines indicate areas covered winch molding resin 11.

As shown in FIG. 4, the first semiconductor module 102 according to embodiment 2 includes one (U-phase) bridge circuit of the inverter circuit 4. The high-potential-side semiconductor switching element 41U is mounted to the base portion 50a that extends from the power terminal 50c. The source portion of the semiconductor switching element 41U is connected to the semiconductor switching element 44U via a jumper wire 45a, and is connected to the drain of the low-potential-side semiconductor switching element 42U via the jumper wire 45a and another base portion 50a. Further, the semiconductor switching element 42U is connected to the shunt resistor 43U via a jumper wire and a base portion 50a, and the shunt resistor 43U is connected to the power terminal 50e which is a ground terminal.

The power terminal 50d which is an output terminal to a motor winding extends in the upward direction in the drawing. The control terminals 50k, 50j, 50f, etc. are arranged alongside the power terminal 50d. The control terminals 50k, 50j are terminals for signals at both ends of the shunt resistor 43U, and adjacently thereto, the control terminals 50f, 50i, 50h which are gate signal terminals for the semiconductor switching elements 41U, 42U, 44U are arranged. A control terminal 50v branching from the power terminal 50d is used for monitoring terminal voltage of the motor 2.

On the other hand, the second semiconductor module 103 shown in FIG. 5 includes the power supply relay 5 (see FIG. 1) as one relay function circuit. The semiconductor switching element 5a is mounted to the base portion 50a that leads to the power terminal 50c which is the plus power supply terminal. The source portion of the semiconductor switching element 5a is connected to the source portion of the semiconductor switching element 5b via a jumper wire. Thus, the power terminal 50d serves as an output terminal of the plus power supply.

Further, the source portion of the semiconductor switching element 5a is connected to another base portion 50a via a jumper wire, and in the case where voltage at the intermediate point between the semiconductor switching elements 5a, 5b needs to be monitored, the other base portion. 50a is connected to the control terminal 50j via a jumper wire 45b. The control terminals 50f, 50h are gate signal terminals for the semiconductor switching elements 5a, 5b, respectively. In the second semiconductor module 103, the control terminals 50k, 50i and the power terminal 50e are not used and correspond to discrimination terminals.

The third semiconductor module 104 shown in FIG. 6 includes the power supply relay 5 as in the second semiconductor module 103, but is different from the second semiconductor module 103 in that the power terminal 50c is used as an output terminal of the plus power supply. Therefore, the power terminal 50d is not used and corresponds to a discrimination terminal. The output side of the semiconductor switching element 5b, i.e., the drain thereof is connected via a long jumper wire 45c from the base portion 50a at the right end in the drawing to the base portion 50a at the left end. In the drawing, and is outputted to the power terminal 50e. In the third semiconductor module 104, the control terminals 50i, 50v and the power terminal 50d are not used and correspond to discrimination terminals.

As shown in FIG. 5, in the second semiconductor module 103, the power terminal 50e which is a discrimination terminal is cut to be short, and thus the second semiconductor module 103 can be easily discriminated from the first semiconductor module 102 and the third semiconductor module 104 by outer appearances. In addition, as shown in FIG. 6, in the third semiconductor module 104, the power terminal 50d which is a discrimination terminal is cut to be short, and thus the third semiconductor module 104 can be easily discriminated from the first semiconductor module 102 and the second semiconductor module 103 by outer appearances.

In the examples shown in FIG. 5 and FIG. 6, one power terminal which is a discrimination terminal in each shared base plate 500 is cut. However, a control terminal which is a discrimination terminal may be cut, or a plurality of discrimination terminals may be cut. Thus, also in embodiment 2, the same effects as in the above embodiment 1 are obtained.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure. It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 control unit
2 motor
2a U-phase winding
2b V-phase winding
2c W-phase winding
3 control circuit
4 inverter circuit
5 power supply relay
5a, 5b semiconductor switching element
6 rotation sensor
7U, 7V, 7W capacitor
8 sensor
9 battery
10 ignition switch
11 molding resin
30 CPU
31 drive circuit
32 input circuit
33 power supply circuit
41U, 42U, 44U semiconductor switching element
43U shunt resistor
45, 45a, 45b, 45c jumper wire
46 wire bond 50 plate
50A outer frame
50B, 50C shared base plate
50a base portion
50b terminal formed portion
50c, 50d, 50e, 50m, 50n power terminal
50f, 50g, 50h, 50i, 50j, 50k, 50p, 50q, 50r, 50s, 50t, 50u, 50v control terminal
100 first semiconductor module
101 second semiconductor module
102 first semiconductor module
103 second semiconductor module
104 third semiconductor module

The invention claimed is:

1. A shared base plate to be used for plural types of semiconductor modules different in circuit configuration or component configuration, the plural types of semiconductor modules include at least a first semiconductor module and a second semiconductor module, each of which is covered with its own separate molding resin, the shared base plate comprising:
a base portion to which one of a first plurality of electronic components of the first semiconductor module and a second plurality of electronic components of the second semiconductor module are to be mounted, the first plurality of electronic components and the second plurality of electronic components each including a semiconductor switching element; and
a terminal formed portion formed so as to extend from the base portion to an outer side, wherein
the terminal formed portion includes a discrimination terminal which is used as a terminal when one of the first plurality of electronic components of the first semiconductor module and the second plurality of electronic components of the second semiconductor module are mounted on the base portion and which is not used as a terminal when other of the first plurality of electronic components of the first semiconductor module and the second plurality of electronic components of the second semiconductor module are mounted on the base portion.

2. The shared base plate according to claim 1, wherein the terminal formed portion includes a control terminal for input and output of a control signal, and a power terminal which is formed to be wider than the control terminal and through which larger current flows than in the control terminal.

3. The shared base plate according to claim 2, wherein the discrimination terminal is used as the control terminal in the first semiconductor module or the second semiconductor module.

4. The shared base plate according to claim 2, wherein the discrimination terminal is used as the power terminal in the first semiconductor module or the second semiconductor module.

5. The shared base plate according to claim 2, wherein when the discrimination terminal is not used as the control terminal or the power terminal, the discrimination terminal is formed to be shorter than the adjacent control terminal or the adjacent power terminal.

6. The shared base plate according to claim 5, wherein the first semiconductor module has at least one bridge circuit, and the second semiconductor module has one relay function circuit.

7. The shared base plate according to claim 5, wherein the first semiconductor module has two bridge circuits, and the second semiconductor module has one bridge circuit and one relay function circuit.

8. A semiconductor module comprising:
the shared base plate according to claim 5;
a plurality of electronic components mounted to the base portion of the shared base plate, the plurality of electronic components being one of the first plurality of electronic components of the first semiconductor module and the second plurality of electronic components of the second semiconductor module;
a wiring member connecting an electronic component among the plurality of electronic components with the base portion or another electronic component of the plurality of electronic components; and
the molding resin covering the base portion, the plurality of electronic components, and the wiring member.

9. The shared base plate according to claim 2, wherein the first semiconductor module has at least one bridge circuit, and the second semiconductor module has one relay function circuit.

10. The shared base plate according to claim 2, wherein the first semiconductor module has two bridge circuits, and the second semiconductor module has one bridge circuit and one relay function circuit.

11. A semiconductor module comprising:
the shared base plate according to claim 2;
a plurality of electronic components mounted to the base portion of the shared base plate, the plurality of electronic components being one of the first plurality of electronic components of the first semiconductor module and the second plurality of electronic components of the second semiconductor module;
a wiring member connecting an electronic component among the plurality of electronic components with the base portion or another electronic component of the plurality of electronic components; and
the molding resin covering the base portion, the plurality of electronic components, and the wiring member.

12. The shared base plate according to claim 1, wherein the first semiconductor module has at least one bridge circuit, and the second semiconductor module has one relay function circuit.

13. The shared base plate according to claim 1, wherein the first semiconductor module has two bridge circuits, and the second semiconductor module has one bridge circuit and one relay function circuit.

14. A semiconductor module comprising:
the shared base plate according to claim 1;
a plurality of electronic components mounted to the base portion of the shared base plate, the plurality of electronic components being one of the first plurality of electronic components of the first semiconductor module and the second plurality of electronic components of the second semiconductor module;
a wiring member connecting an electronic component among the plurality of electronic components with the base portion or another electronic component of the plurality of electronic components; and
the molding resin covering the base portion, the plurality of electronic components, and the wiring member.

* * * * *